US012648407B2

(12) United States Patent
Hsiao et al.

(10) Patent No.:  US 12,648,407 B2
(45) Date of Patent:      Jun. 2, 2026

(54) WAFER TRANSPORT METHOD AND APPARATUS

(71) Applicant: TAIWAN SEMICONDUCTOR MANUFACTURING COMPANY, LTD., Hsinchu (TW)

(72) Inventors: Kai-Hung Hsiao, Kaohsiung (TW); Chi-Chung Jen, Kaohsiung (TW); Yu-Chun Shen, Tainan (TW); Yuan-Cheng Kuo, Kaohsiung (TW); Chih-Hsiung Huang, Hsinchu County (TW); Wen-Chih Chiang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 411 days.

(21) Appl. No.: 18/112,980

(22) Filed: Feb. 22, 2023

(65) Prior Publication Data

US 2024/0079263 A1     Mar. 7, 2024

Related U.S. Application Data

(60) Provisional application No. 63/404,127, filed on Sep. 6, 2022.

(51) Int. Cl.
*H01L 21/673*          (2006.01)
*H01L 21/687*          (2006.01)

(52) U.S. Cl.
CPC .... *H01L 21/68721* (2013.01); *H01L 21/6732* (2013.01)

(58) Field of Classification Search
CPC ........... H01L 21/6732; H01L 21/67309; H01L 21/67436; H01L 21/67326; H01L 21/67369; H01L 21/67383
USPC ........................................................ 206/710
See application file for complete search history.

(56) References Cited

U.S. PATENT DOCUMENTS

| | | | |
|---|---|---|---|
| 8,796,666 B1 | 8/2014 | Huang et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |
| 2009/0032433 A1* | 2/2009 | Lin | H01L 21/67369 206/711 |
| 2015/0068948 A1* | 3/2015 | Hong | H01L 21/67323 206/711 |
| 2016/0135592 A1* | 5/2016 | Hong | G02F 1/1303 211/26 |
| 2019/0139792 A1* | 5/2019 | Liu | H01L 21/67383 |

(Continued)

*Primary Examiner* — Kaitlin S Joerger
(74) *Attorney, Agent, or Firm* — STUDEBAKER BRACKETT PLLC

(57)          ABSTRACT

A wafer container includes a frame, a door and at least a pair of shelves. The frame has opposite sidewalls. The pair of the shelves are respectively disposed and aligned on the opposite sidewalls of the frame. Various methods and devices are provided for holding at least one wafer to the shelves during transport.

20 Claims, 12 Drawing Sheets

(56) References Cited

U.S. PATENT DOCUMENTS

| | | |
|---|---|---|
| 2020/0174374 A1 | 6/2020 | Liao et al. |
| 2021/0028039 A1 * | 1/2021 | Tindel ............... H01L 21/67383 |

* cited by examiner

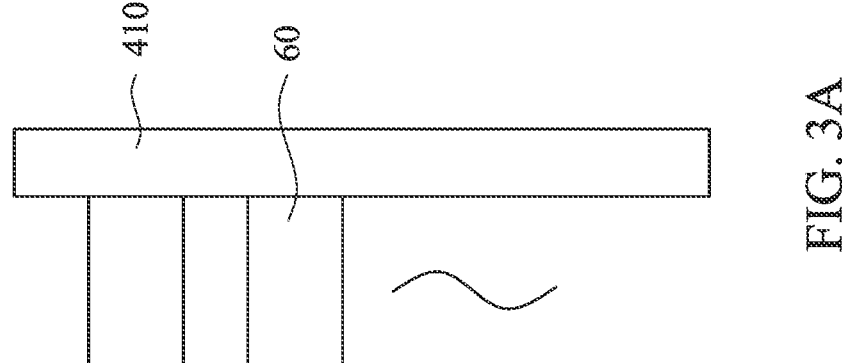
410
60
FIG. 3A
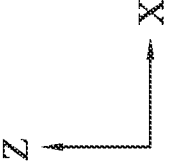
X
Z

114a

114b

114c

114d

WAFER TRANSPORT METHOD AND APPARATUS

CROSS-REFERENCE TO RELATED APPLICATIONS

This application claims priority under 35 U.S.C. § 119(e) to U.S. Provisional Patent Application Ser. No. 63/404,127 entitled "WAFER TRANSPORT METHOD AND APPARATUS" filed on Sep. 6, 2022, the entirety of which is hereby incorporated by reference.

BACKGROUND

Modern semiconductor integrated circuit fabrication facilities ("FABs") are automated. Robotics are commonly used within the FABs to place and transfer semiconductor wafers, also known as substrates, throughout the fabrication area. Movement of semiconductor wafers between various process tools is accomplished by an automated material handling system (AMHS). Wafer cassettes are typically used to retain a group of wafers, commonly referred to collectively as a "lot." Many times throughout a manufacturing process, semiconductor wafers within the lots must be transported and loaded into and out of the wafer cassettes for further manufacturing without inflicting damage to existing semiconductor structures. To avoid damage to semiconductor wafers caused by shaking during transport, the transport speed may be limited, which in turn, adversely affects overall facility manufacturing throughput.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3A is a side view of a door of a wafer container in accordance some embodiments.

DETAILED DESCRIPTION

Figure 1A:
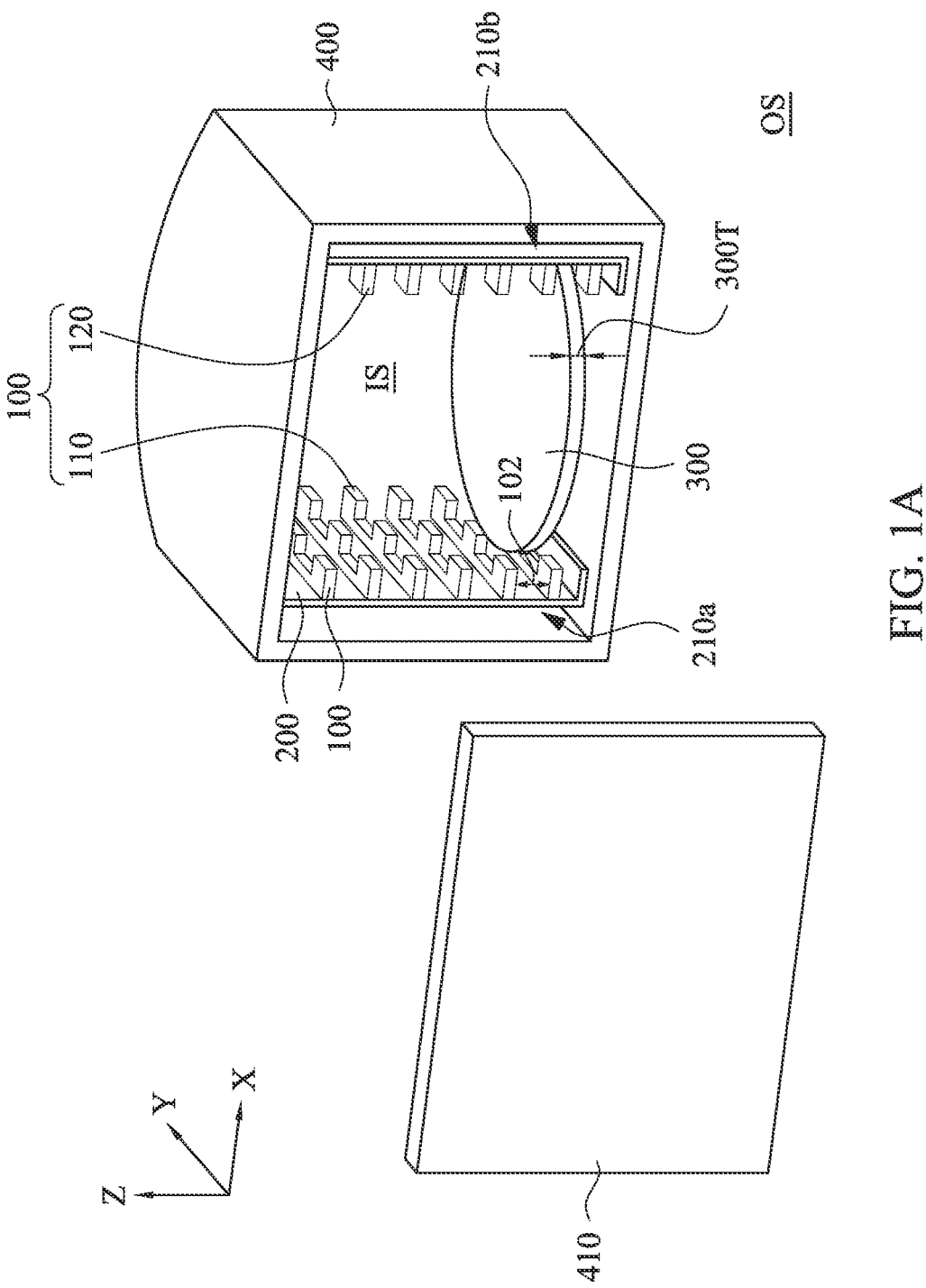
FIG. 1A is a schematic view of a wafer container in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

FIG. 1A is a schematic view of a wafer container 10 in accordance with various embodiments. Referring to FIG. 1A, the wafer container 10 includes a frame 400 according to various embodiments. In some embodiments, the wafer container 10 is utilized for shipping at least one wafer 300. In some embodiments, there are some features (not shown) disposed on the exterior of the frame 400 for fixing the wafer container 10 in place or moving the wafer container 10, such as slides or the like. In some instances, the frame 400 is never fully sealed and the door 410 of the frame 400 leaves an air gap at the edge of the door 410 when the door 410 is closed. As a result, in such embodiments, the inner space (IS) is in fluid communication with the outer space (OS) of the environment. In additional embodiments, the frame 400 is instead fully sealed from an external environment when the door 410 is closed.

In various embodiments, the frame 400 of the wafer container 10 is an enclosure configured to hold one or more wafers 300 in a protected environment. In some embodiments, the wafers 300 are supported by a retaining feature, which is one or more of a rack, a bracket, a shelf, a clip, a framework, a stent or other feature to support the wafers 300 during transport and handling. In some embodiments, the frame 400 has a generally rectangular shape with three interconnected walls (two opposing walls disposed in the Y-Z plane with an intervening connecting wall disposed in the X-Z plane as shown), a door 410 (disposed in the X-Z plane opposite the intervening connecting wall), a top (disposed in the X-Y plane), and a base opposite the base disposed in the X-Y plane). In alternate embodiments, a rear wall of the frame 400 is curved or straight. The wafer container 10 may be alternatively shaped in other embodiments. In some instances, the frame 400 has curved internal corners, orthogonal internal corners, or a combination of both types of corners. In some embodiments, the frame 400 is made of a rigid material to protect and securely hold the wafers 300 inside. In additional examples, the frame 400 is formed from plastic materials such as polyvinyl chloride (PVC).

In various embodiments, the wafer container 10 illustrated in FIG. 1A is a front opening unified pod (FOUP), but is not so limited. In alternative embodiments, the wafer container 10 includes a front opening shipping box (FOSB), a standardized mechanical interface (SMIF) pod, a wafer sorter, a wafer cassette or a combination thereof.

As shown in FIG. 1A and in some embodiments, the frame 400 has at least a pair of sidewalls 210a and 210b disposed on opposing interior sides or walls within the frame 400. In various embodiments, the pair of the shelves 100 are respectively disposed on the sidewalls 210a and 210b of the frame 400. That is, the pair of the shelves 100 are respectively stationary with respect to the sidewalls 210a and 210b of the frame 400 in various embodiments.

As shown in FIG. 1A, the wafer container 10 includes at least a pair of the shelves 100 (including first shelf 110 and second shelf 120) disposed in alignment on opposite sidewalls 210a, 210b within the frame 400 in some embodiments. In various embodiments, the pair of the shelves 100 and the frame 400 are made of a soft material that will minimize or prevent inducing damage to a wafer 300, for example, a rigid plastic, a rubber, or a combination thereof. In some embodiments, the pair of the shelves 100 and the frame 400 are made of the same or different materials. In some embodiments, the pair of the shelves 100 cooperatively support opposing sides of a wafer 300. The frame 400 carries the pair of the shelves 100 and allows access to the pair of the shelves 100 when the door 410 is open. In various embodiments, the pair of the shelves 100 are substantially horizontally aligned, so that the wafer 300 is substantially level when supported thereon.

In various embodiments, it is understood that there are more than one, or several pairs of shelves 100, which are disposed in a stacked manner and substantially in parallel to maintain a plurality of wafers 300 in substantially the same orientation simultaneously within the wafer container 10. In some embodiments, there are plural pairs of the shelves 100 disposed on the sidewalls 210a and 210b of the frame 200. The pairs of the shelves 100 are respectively stationary with respect to the sidewalls 210a and 210b of the frame 200 and vertically spaced apart to each define at least one slot available for wafers 300 in various examples. In some embodiments of the present disclosure, the pairs of the shelves 100 are stacked in the Z direction. Through the configuration of the pairs of the shelves 100, the shelves 100 support the edges of the wafers 300 when the wafers 300 are stored in the wafer container 10. In some embodiments, a gap 102 between two adjacent shelves 100 in the Z direction is greater than the thickness 300T of the wafer 300, so that the wafer 300 are easily inserted into and accommodated within gap 102 on opposing aligned shelves 110, 120. In some embodiments, the gap 102 is between about 1 millimeters (mm) and about 5 mm, such as 4 mm.

Figure 1B:
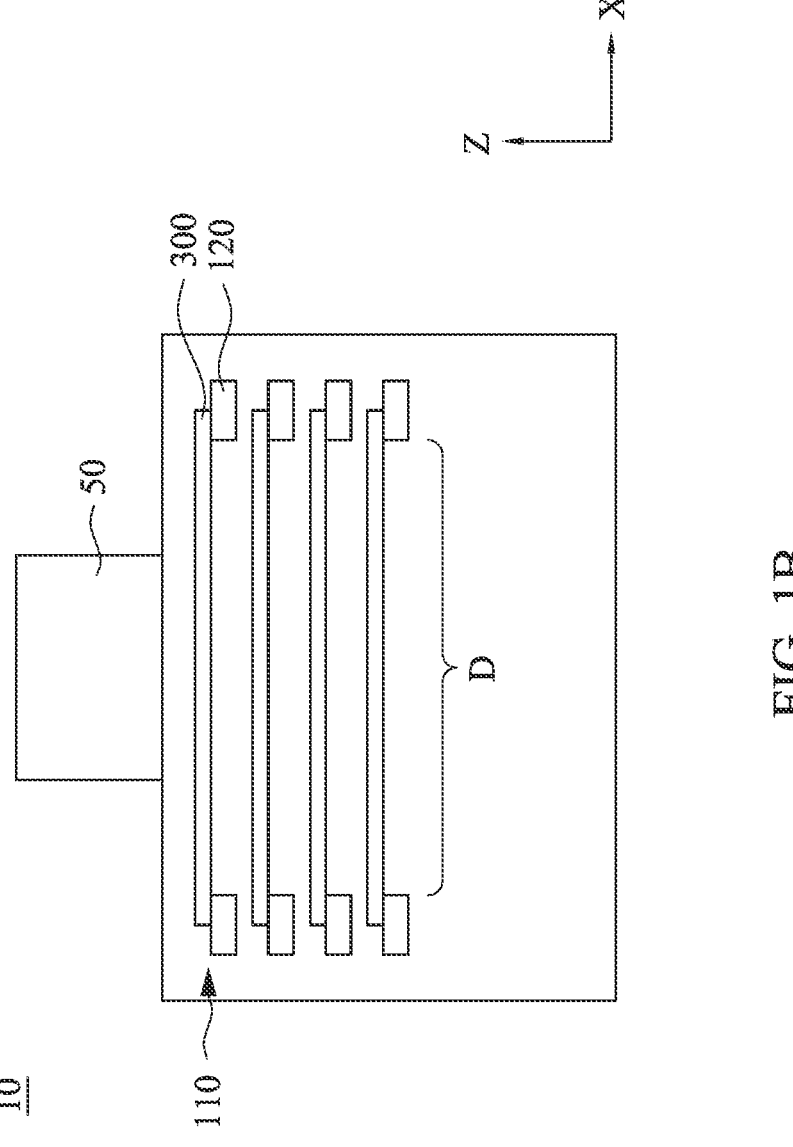
FIG. 1B is a front view of a wafer container in accordance with some embodiments.

FIG. 1B is a front schematic view of a wafer container 10 in accordance with various embodiments. As shown in FIG. 1B, and in accordance with some embodiments, the pair of the shelves 100 includes at least a first shelf 110 and a second shelf 120 in alignment opposite to each other within the frame 400. In some embodiments, the first shelf 110 and the second shelf 120 are substantially horizontally and vertically aligned, so that the wafer 300 is maintained substantially level when placed thereon. In some embodiments, the first shelf 110 is separated from the second shelf 120 by a distance D in the X direction. In some embodiments, the distance D is less than a length or diameter of the wafer 300, such that the edges of the wafers 300 is supported therein without interfering with a chips region on such wafers. In some embodiments, the distance D is between about 3 inches (in) and about 20 in, such as 10 in.

Figure 2B:
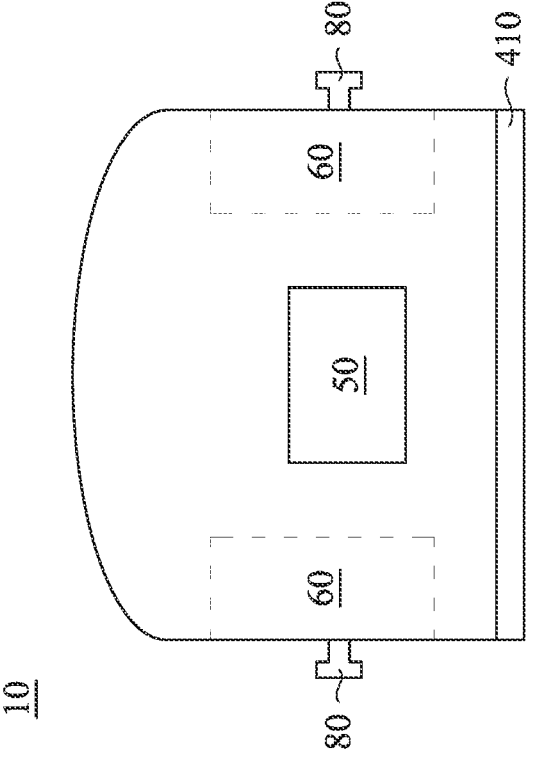
FIG. 2B is a top view of a wafer container in accordance with some embodiments.
Figure 2A:
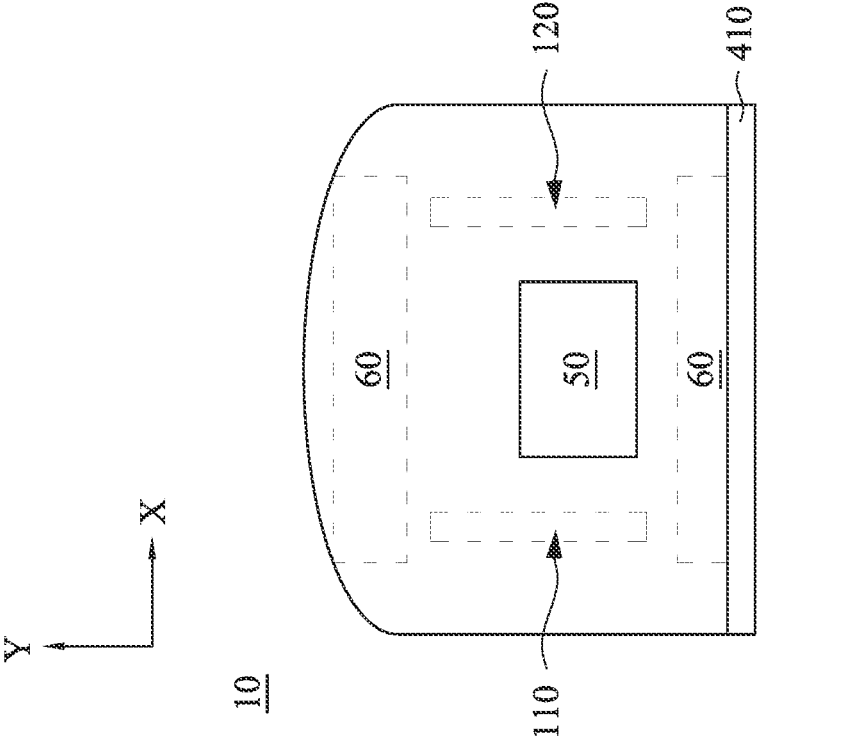
FIG. 2A is a top view of a wafer container in accordance with some embodiments.

FIG. 2A is a top view of the wafer container 10 according to various embodiments. As shown in FIG. 2A, the wafer container 10 includes a handle 50 disposed on its top surface in some embodiments. The handle 50 is used to manually or robotically transport the wafer container 10 in various embodiments. In some examples, the wafer container 10 includes settlers 60 (such as holders or receivers) for securing the ends of the wafers 300 to the ends of the shelf 110 and the shelf 120. In some embodiments, a settler 60 is provided for each shelf 110, 120. In some embodiments, the settlers are disposed on opposite sides of the frame 400. In some embodiments, a settler 60 is disposed along the X direction on an inside surface of the door 410 and an inside surface of a back wall of the frame 400 as shown in FIG. 2A. In some embodiments, the settlers 60 are made of soft material, such as rubber, nylon, propylene and/or a rigid polymer so as to minimize or prevent damage to the wafers 300 when engaged therewith.

FIG. 2B is a top view of the wafer container 10 with settlers and adjustors according to various embodiments. As shown in FIG. 2B, the settlers 60 are disposed on opposing sides of the frame 400, instead of on the door 410 or the back wall of the frame 400 in some instances. In various embodiments, an adjuster 80 is provided to manually or electromechanically adjust the settlers 60 so as to grip or otherwise secure the end of the wafers 300 when disposed on the pairs of shelves 100 within the wafer container 10. In some embodiments, this arrangement provides for more ready transport of the wafers 300 without inducing damage thereto. The configuration and functionality of the settlers 60 and the adjusters 80 will be described in more detail with respect to FIGS. 3E-5D below.

Figure 3C:
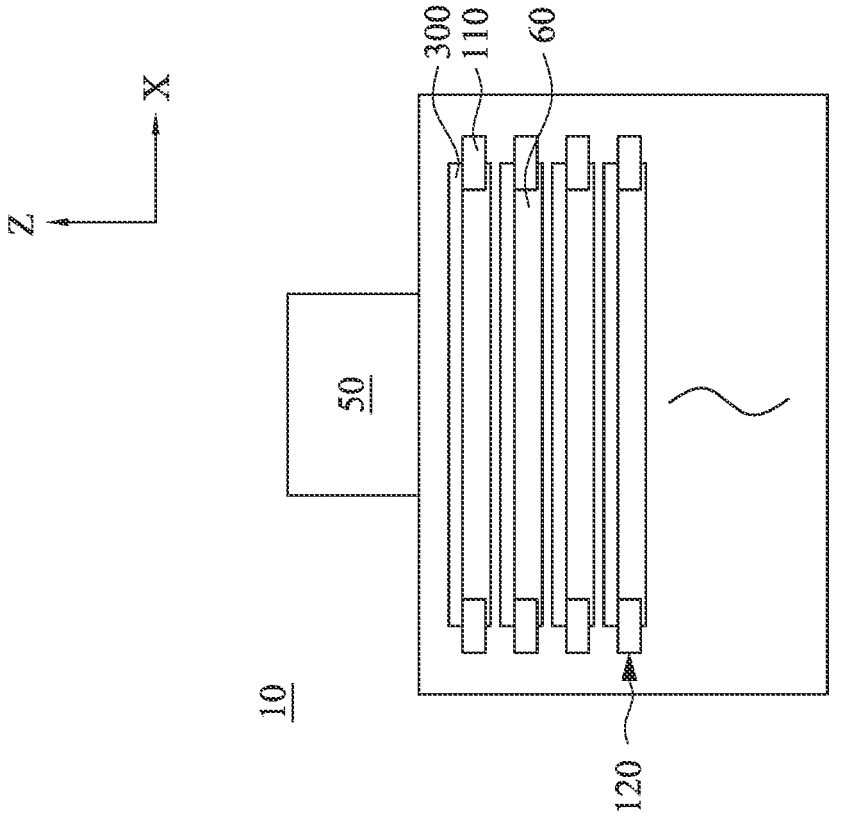
FIG. 3C is a side view of a wafer container in accordance with some embodiments.

FIGS. 3A to 3F are schematic views of a pair of shelves 100 and/or their components in accordance various embodiments. FIG. 3A is a side view of a door 410 of the wafer container 10 having a plurality of settlers 60 disposed thereon in some instances. In certain embodiments of the arrangement shown in FIG. 3A, the action of closing the door 410 causes the settlers 60 to secure any wafers 300 disposed therein, either directly such as by providing a guide (not shown) that forces the settlers 60 to move in place as the door 410 is closed, or by causing an adjuster 80 described herein to move the settlers 60 as the door 410 closes.

Figure 3B:
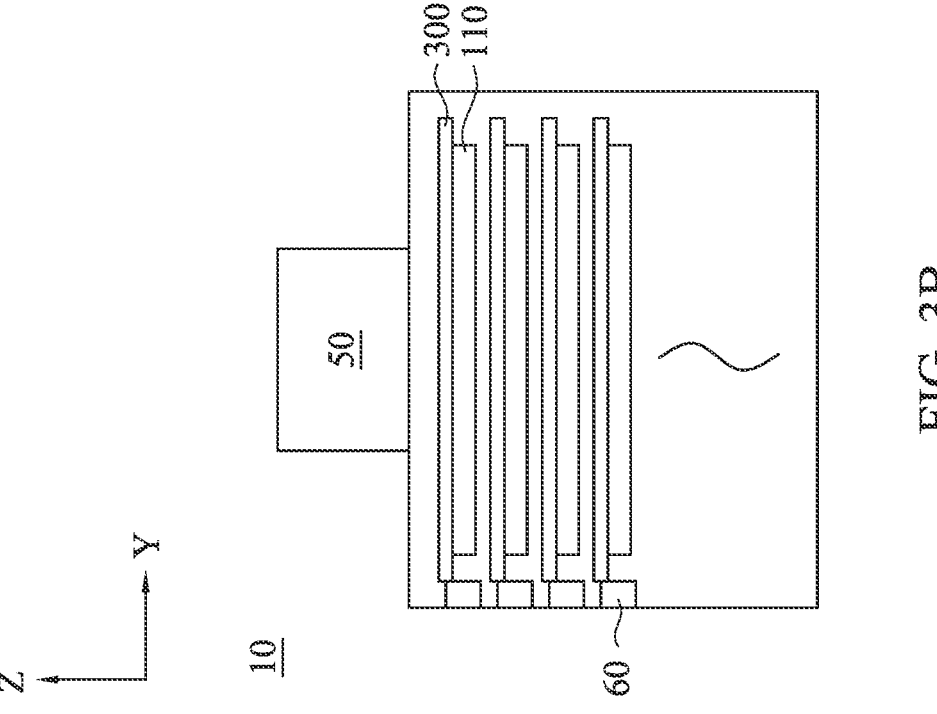
FIG. 3B is a side view of a wafer container in accordance with some embodiments.

FIG. 3B is a side view of a wafer container 10 having a plurality of shelves 110 disposed on one interior wall thereof, a plurality of wafers 300 supported thereon and a plurality of settlers 60, in various embodiments. In some examples, the settlers 60 are aligned with a respective one of the shelves 110, in order to secure an end of a wafer 300 thereto. In some embodiments, only a single set of stacked shelves 110 are provided.

FIG. 3C is a rear view of a wafer container 10 having a plurality of stacked shelves 110 dispose on a first interior wall and having a plurality of stacked shelves 120 disposed on an opposing interior wall of the wafer container 10 and in alignment with the plurality of stacked shelves 110. In some embodiments, a plurality of settlers 60 are provided, with one settler provided for each pair of aligned shelves 110, 120.

Figure 3D:
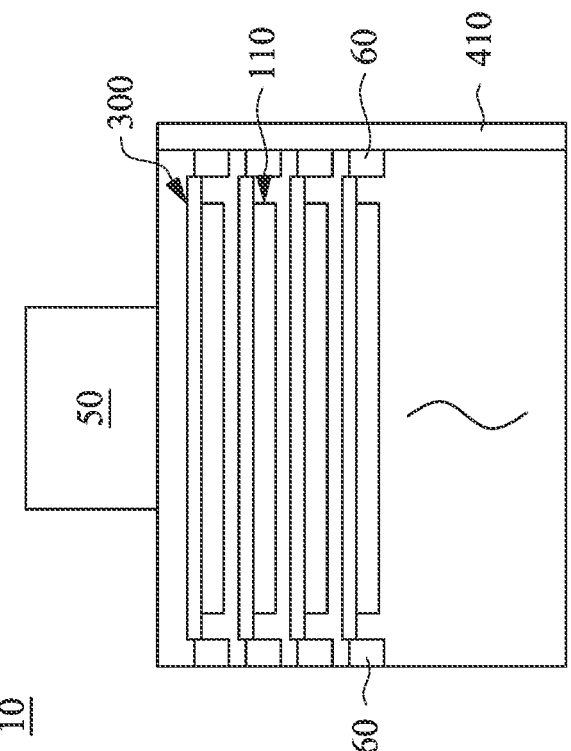
FIG. 3D is a side view of a wafer container in accordance with some embodiments.

FIG. 3D is a side view of a wafer container 10 according to various embodiments. In some instances where settlers 60 are disposed on the door 410 and the back wall of the wafer container 10, wafers 300 placed in shelves 110 are settled simultaneously by the settlers 60 when the door 410 is closed. In various embodiments, when a wafer is placed on opposing shelves 100 inside the wafer container 10, there is distance of between about 1 mm and 5 mm between the edges of the wafers 200 and an edge of each shelf 110, 120. Without additional precautions, there is the potential for the wafer 300 suffer different types of defects or a low yield event due, at least in part, to shaking or collision when the wafers 300 are transported, for example, between FABs in the wafer container 10. In some facilities, the robotics for transporting wafers are given a speed limit of between 20 kilometers per hour (kph) and 30 kph to prevent or reduce wafer shaking. In addition, the shaking amplitude is also monitored by the robotics during transport using appropriate sensors and is used as a parameter to further control and limit robotics' movement and speed. Due to these low speeds though, it takes increased time to transport wafers between FABs, which in turn, adversely affects overall facility manufacturing throughput. Various types of wafer settlers 60 and settler adjusters 80 are employed in various embodiments to secure, stabilize and immobilize wafers 300 with respect to the shelves 100 on which they are placed within the wafer container 10 when it is being transported. In various embodiments, by stabilizing the wafers 300, the transportation time between FABs, as well as defects caused during transportation, can be reduced, which, in turn, improves the manufacturing throughput of semiconductor manufacturing facilities.

Figure 3F:
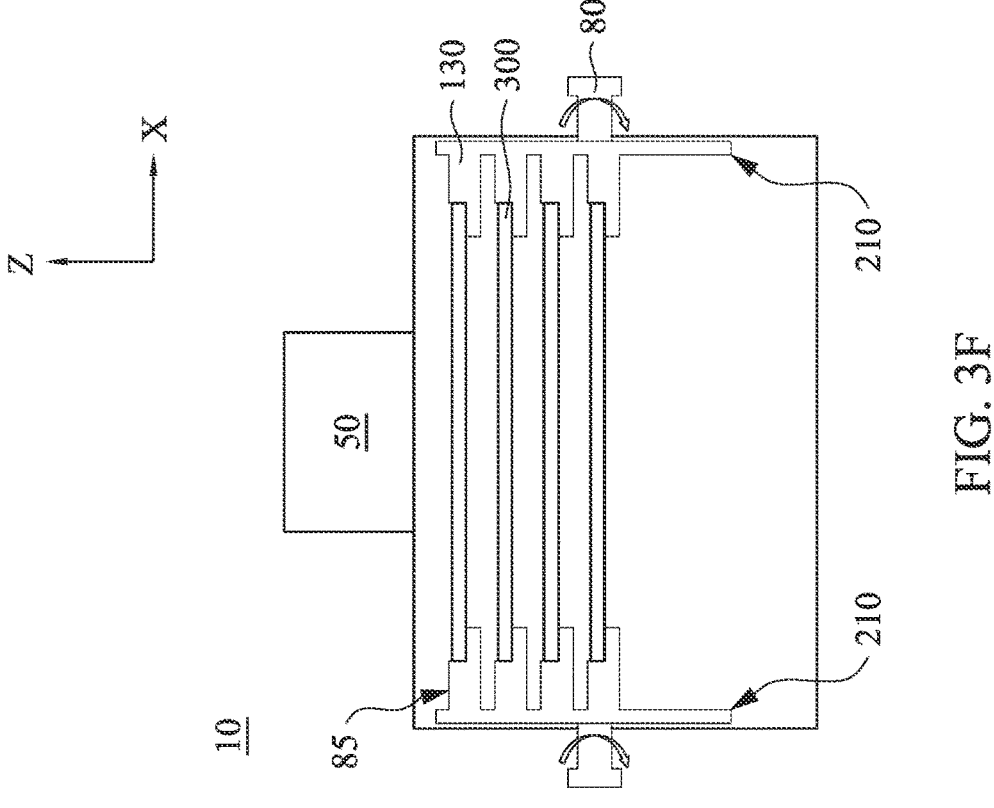
FIG. 3F is a side view of a wafer container in accordance with some embodiments.
Figure 3E:
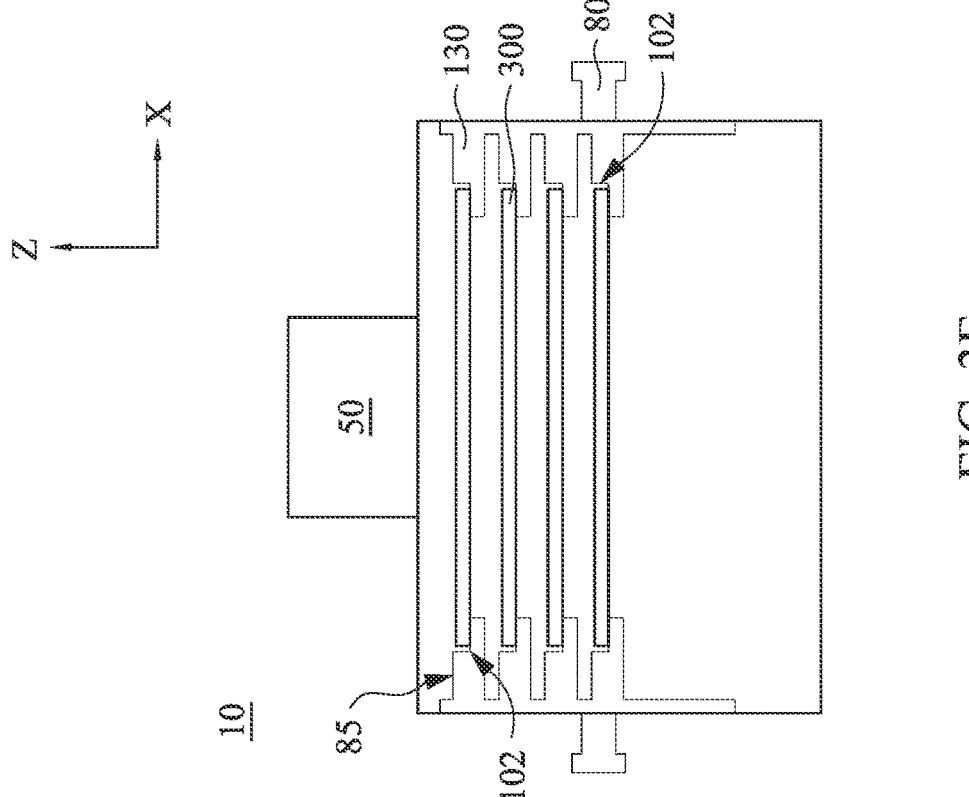
FIG. 3E is a side view of a wafer container in accordance with some embodiments.

Referring to FIG. 3E, there is shown a side view of a wafer container 10 having a first type of wafer settler 60, referred to herein as an adjustable shelf 130. In some embodiments, the adjustable shelf 130 includes the same components and materials as previously described for the pair of shelves 100, including the first shelf 110 and the second shelf 120. In some embodiments, the adjustable shelf 130 includes an engagement arm or retaining arm 85 disposed on a top surface thereof. In some embodiments, the retaining arm 85 is made of a soft but structurally rigid material, such as a rubber or a plastic, so that the wafers 300 are held in place without causing damage thereto during vibration events and transport. In some instances, the length of the retaining arm 85 along the top surface of the adjustable shelf 130 is adjustable by one or more adjusters 80. In some embodiments, one adjuster 80 is provided to control one retaining arm 85 on an adjustable shelf 130. In some embodiments, one adjuster 80 controls retaining arms 85 disposed on opposing adjustable shelves 130 on opposing walls or sides of the wafer container 10. In some embodiments, one adjuster 80 controls more than one or all retaining arms 85 simultaneously.

In some embodiments, the adjusters 80 are manually adjusted. In some embodiments, the adjusters are electromechanically controlled locally or remotely. In various instances, when a wafer is first placed on a pair of adjustable shelves 130, there exists a gap 102 between ends of the wafer 300 and a leading edge of the retaining arm 85. When adjusted by the adjuster 80, the retaining arms 85 advance through the gap 102 to contact the edges of the wafers 300, thereby securing them in place for transport, without impacting any chip regions thereon.

Referring to FIG. 3F, there is depicted a side view of the wafer container 10 in which the adjuster(s) 80 have been adjusted so that the gap 102 is closed and the retaining arms 85 are secured to the edges of the wafer 300, in various embodiments. In some embodiments, the adjusters 80 are rotated or otherwise actuated simultaneously on both sides of the wafer container 10 in order to secure one or more wafers 300 simultaneously by manual action or machine/robotics. In some embodiments, the adjustable shelves 130 are disposed on the sidewalls 210 of the wafer container 10.

Figure 4A:
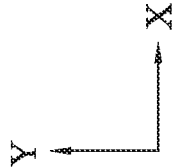
FIG. 4A is a top view of a pair of shelves in accordance with some embodiments.
Figure 4A:
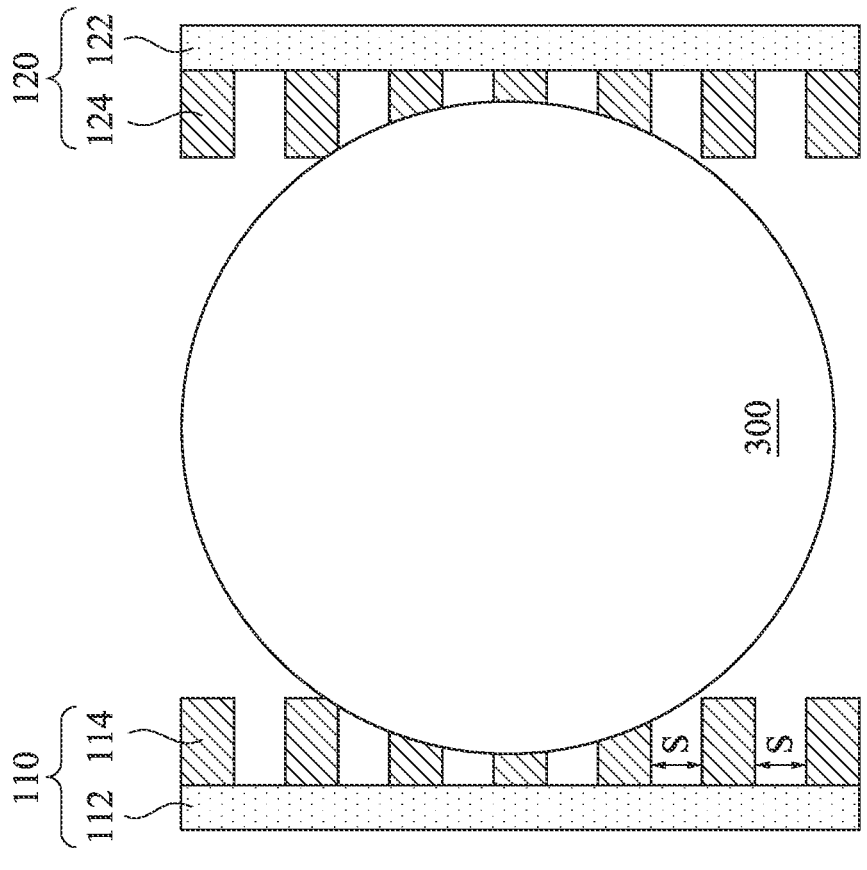

FIG. 4A is a top view of additional embodiments of a pair of shelves 100. In various embodiments, the pair of shelves 100 includes a first shelf 110 having a first connection portion 112 and a plurality of first comb portions 114. In some embodiments, the plurality of first comb portions 114 are connected to the first connection portion 112 to form a first comb structure. In some embodiments, the first connection portion 112 extends along a Y direction and is fixed on a sidewall 210a, 210 b as previously described. In some instances, a length of the first connection portion 112 in the Y direction is greater than the diameter of the length of the wafer 300 being supported thereby. In some embodiments, the length of the first connection portion 112 in the Y direction is in a range of 300 mm to 50 cm. In some embodiments, the plurality of first comb portions 114 are arranged along the first connection portion 112 in the Y direction. In some examples, one or more of the plurality of first comb portions 114 is a continuous structure extending in an X direction perpendicular to the sidewall 210a, 210b. In some alternative embodiments, all of the plurality of first comb portions 114 are continuous structures extending in the X direction perpendicular to the sidewall 210a, 210b. In some embodiments, the first comb portion 114 has a length of between about 3 mm and about 12 mm, and a width of about 1 mm to about 2 mm. In some embodiments there is a gap of between about 3 mm and about 10 mm between adjacent first comb portions 114. In some embodiments, the length of one of the first comb portions 114 and the length of another of the first comb portions 114 are the same as or different from each other. In some instances, the width of one of the first comb portions and the width of another of the first comb portions 114 are the same as or different from each other. In some embodiments, the plurality of first comb portions 114 are arranged along the Y direction with equal spacing. In some embodiments, the plurality of first comb portions 114 are arranged along the Y direction with nonequal spacing.

In various embodiments, the second shelf 120 includes a second connection portion 122 and a plurality of second comb portions 124. In some instances, the plurality of second comb portions 124 are connected to the second connection portion 122 to form a second comb structure. In some embodiments, the second connection portion 122 extends along the Y direction and is fixed on an opposing sidewall 210a, 210b from the first connection portion 112. In some embodiments, the plurality of second comb portions 124 are arranged along second connection portion 122 in the Y direction. In some embodiments of the present disclosure, one of the plurality of second comb portions 124 are a continuous structure extending in the X direction perpendicular to the sidewall 210*a*, 210*b*. In alternate examples, all of the plurality of second comb portions 124 are continuous structures extending in the X direction perpendicular to the sidewall 210*a*, 210*b*. In some embodiments, the lengths and widths of the plurality of second comb portions 124 are the same as the first comb portions 122 as previously described. In some embodiments, the length of one of the second comb portions 124 and the length of another of the second comb portions 124 are the same as or different from each other. In some embodiments, the width of one of the second comb portions 124 and the width of another of the second comb portions 124 are the same as or different from each other. In some instances, the length of one of the second comb portions 124 and the length of one of the first comb portions 114 are the same as or different from each other. In some embodiments, the width of one of the second comb portions 124 and the width of one of the first comb portions 114 are the same. In some embodiments, the plurality of second comb portions 124 are arranged along the Y direction with equal spacing. In some embodiments, the plurality of second comb portions 124 are arranged along the Y direction with non-equal spacing.

In some embodiments, at least one of the plurality of first comb portions 114 is arranged to correspond to at least one of the plurality of second comb portions 124. That is to say, in some embodiments a projection of one of the plurality of first comb portions 114 on a YZ plane overlaps with another projection of one of the plurality of second comb portions 124 on the YZ plane. In some alternative embodiments, a projection of all of the plurality of first comb portions 114 on the YZ plane overlap with another projection of all of the plurality of second comb portions 124 on the YZ plane. In some instances, the number of the plurality of first comb portions 114 and the number of the plurality of second comb portions 124 are the same. In other embodiments, they differ.

In various embodiments, a wafer 300 is in direct and/or physical contact with the plurality of first comb portions 114 at one or more first contact regions. In some embodiments of the present disclosure, the first contact regions are non-continuous in the Y direction. That is to say, the first contact region(s) are spaced from each other by a distance S and do not connect to each other in some instances. Similarly, the wafer 300 is in direct and/or physical contact with the plurality of second comb portions 124 at one or more second contact regions. In some embodiments, the second contact region(s) between the wafer 300 and the plurality of second comb portions 124 are non-continuous in the Y direction. Accordingly, the contact area between the wafer 300 and the shelves 110, 120 is decreased significantly depending on the number and configuration of contact regions, which has the benefit of reducing incidence of damage to the wafers 300.

In some embodiments, the plurality of first comb portions 114 are arranged to interleave with the plurality of second comb portions 124. In some of these embodiments, a projection of one of the plurality of first comb portions 114 on the YZ plane overlap with another projection of one space between the adjacent two second comb portions 124 on the YZ plane. In alternate examples, a projection of all of the plurality of first comb portions 114 on the YZ plane overlap with another projection of all spaces between the plurality of second comb portions 124 on the YZ plane, or vice-versa. Although the plurality of first comb portions 114 and the plurality of second comb portions 124 are arranged in an interleaving configuration, this should not be limiting. For example, in some alternative embodiments of the present disclosure, the plurality of first comb portions 114 and the plurality of second comb portions 124 are arranged in a partially interleaving configuration or in a partially overlapped configuration.

In some embodiments of the present disclosure, the number of the plurality of first comb portions 114 and the number of the plurality of second comb portions 124 are different from each other. In other embodiments, the number of the plurality of first comb portions 114 and the number of the plurality of second comb portions 124 are the same, while the plurality of first comb portions 114 are configured to be interlaced with the plurality of second comb portions 124. In some examples, the plurality of first comb portions 114 and the plurality of second comb portions 124 are arranged in a completely interleaving, partially interleaving, completely aligned, or partially aligned configuration depending on design needs.

Although the sum of the plurality of first comb portions 114 and the plurality of second comb portions 124 illustrated in FIG. 4A is seven such comb portions, this is exemplary only and does not limit the present disclosure where any useful number of comb portions are used. In some embodiments, the sum of the plurality of first comb portions 114 and the plurality of second comb portions 124 is at least three comb portions that are able to form a triangle to hold the wafer 300. In these and other additional embodiments, the at least three contact regions provided by the comb portions prevents the wafer 300 from tipping during transport. Although the plurality of comb portions 114, 124 illustrated in FIG. 4A are continuous structures, it should not be viewed as limiting the present disclosure. As used herein, the term "continuous structure" indicates that the contact region or contact area between the wafer and one of the comb portions is continuous. In some alternative embodiments of the present disclosure, one of the plurality of comb portions is a non-continuous structure.

As shown in FIG. 4A, the pair of the shelves 100 is configured to provide at least three supporting points to support the wafer 300. That is to say, the wafer 300 is in contact with the shelves 100 (i.e., the first shelf 110 and the second shelf 120) at the three supporting points in some embodiments. A centroid of a triangle formed by the three supporting points overlaps a center of the wafer 300 in some embodiments. Therefore, the wafer 300 is able to be balanced by the three supporting points, while preventing tipping of the wafer 300. Although the number of the supporting points illustrated is three, this disclosure is not so limited. In some alternative embodiments of the present disclosure, the number of the supporting points (where the wafer 300 is in direct contact with at least a portion the shelves 100 or its components) is more than three, such as 4, 5, 6 or more points.

Figures 4B, 4C, 4D:
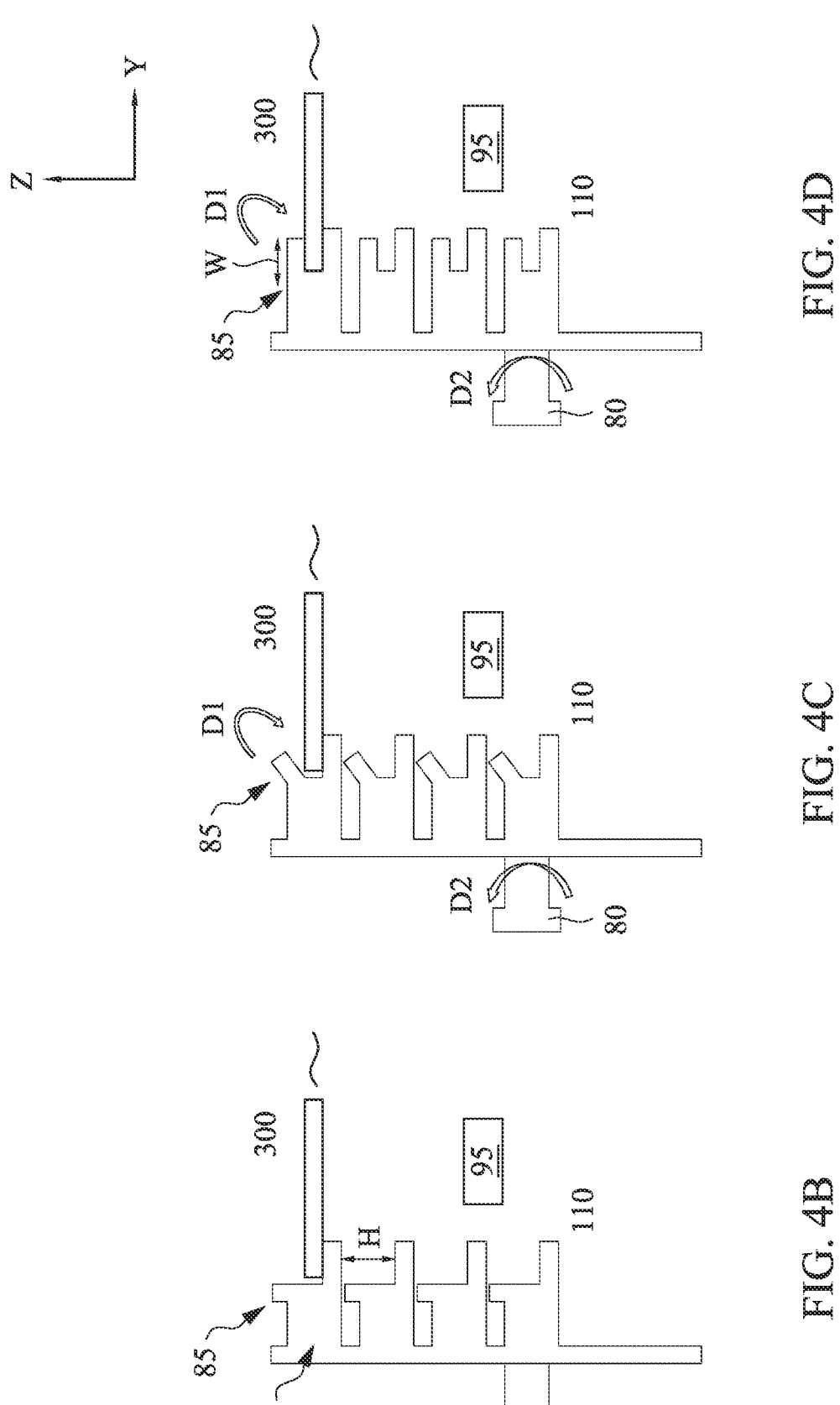
FIG. 4B is a side view of several shelves in accordance with some embodiments.
FIG. 4C is a side view of several shelves in accordance with some embodiments.
FIG. 4D is a side view of several shelves in accordance with some embodiments.

FIGS. 4B, FIG. 4C and FIG. 4D are side views showing a sequential operation of a portion of a shelf 110 of the wafer container 10 in accordance with various embodiments. As shown in FIG. 4B, a plurality of stacked shelves 110 are disposed along an interior wall of the wafer container 10. Opposing shelves 120 are provided on an opposing wall in similar manner in various instances. In some embodiments, there is a height H of between about 1 mm and 4 mm between each shelf 110 in order to receive a wafer 300 thereon. In some embodiments, the wafer 300 is a single layer wafer having a thickness of about 1 mm. In some embodiments, the wafer 300 is a bonded wafer having a thickness between about 2 mm and about 4 mm. In some embodiments, the wafer 300 includes a chip region on at least a top surface thereof and further includes edges without any semiconductors thereon. In such instances, the width of the edge region is about 1 mm to about 4 mm to allow the wafers to be gripped without incurring any damage to the functionality thereof.

In various embodiments, a position sensor 95 is provided to monitor a position of one or more wafers 300 placed within the wafer container 10. In various embodiments, the position sensor 95 is a magneto-resistive sensor (MRS) or an optical sensor, or any other useful sensor that is used to sense the relative positional relationship between the wafer 300 (or its edges) on the shelf 110. In some examples, where the settlers 60 provided to secure the wafers 300 on the shelves 110 are automated and electromechanically actuated, the position sensor 95 provides position signals to control the adjuster 80 to change the position of a retaining arm 85 of the settler 60 until it secures the edge of the wafer 300. In such embodiments, the position sensor 95 provides a signal to cease adjusting the settler 60 once the wafer 300 is sufficiently secured. Other types of sensors, such as pressure sensors placed on the shelf 110 are used in various embodiments in place of or in addition to the position sensor 95, in order to determine a position of the wafers 300.

As previously described, in various embodiments, one or more settlers 60 are provided on one or more of the shelves 110, 120 in order to stabilize the wafers 300 inside the wafer container 10 as it is being transported. In some embodiments, the settler 60 is disposed on the door 410 or on one or more of the wafer shelves 110, 120. In some instances, the settler 60 is adjusted by manual force or by automation. In some embodiments, the settler 60 is a claw-shaped device, such as a clamp that grips the edge of a wafer 300 in order to readily stabilize it for transport.

In some embodiments, the clamp is disposed at an interior end of the pair of shelves 100 for securing an end of a wafer 300. In some embodiments, the claw-shaped device is an appliance with opposing retaining arms 85 that are adjusted or brought closer together to hold the top and bottom surface of a wafer edge. In some embodiments, the clamp is v-shaped. In some embodiments a single retaining arm 85 is disposed above a comb portion of the shelf 110. In some embodiments, a gap between the retaining arm 85 and the shelf 110 is designed and sized to accommodate wafers 300 including normal wafers and/or bonded wafers. In some embodiments, the retaining arm 85 is maintained in a substantially vertical position with respect to the shelf 110 before a wafer 300 is loaded. In some instances, the position of the retaining arm 85 is adjusted by an adjuster 80 from the vertical position to a substantially horizontal position in order to engage a top surface of the edge of the wafer 300 outside of any chip region. In some embodiments, the retaining arm 85 is made of soft material softer than aluminum, including, but not limited to tin, nylon, a rigid plastic, polypropylene (PP), silicone and rubber. In some embodiments, at least a portion of the retaining arm 85 is composed of rubber, nylon or other soft material, that enables it to grasp a wafer 300 without causing damage. In some embodiments, the length of the retaining arm 85 is between about 1 mm and about 3 mm.

In various embodiments, an adjuster 80, as previously described, is provided to adjust the settlers 60 in order to stabilize the wafers 300 when transporting, and then release the wafers 300 for processing at their destination. In some embodiments, the adjuster 80 is a switch, a knob, a button, a dial or other similar manually-actuable element. For example, when a settler 60 is adjusted in a direction D2, such as counter-clockwise, the retaining arm 85 correspondingly moves in a direction D1 to eventually secure the edge of the wafer 300. In some embodiments, the adjuster 80 is moved in the clockwise direction for closing the retaining arm 85. In other embodiments, the adjuster 80 instead moves in other directions, such as into or out of the frame 400, for adjusting the settlers 60.

In some embodiments, one adjuster 80 is provided to adjust one settler 60. In some embodiments, an adjuster 80 controls more than one settler 60, including settlers 60 disposed on the same side or on opposing shelves 110, 120 within the wafer container 10. In some examples, adjusters 80 are disposed on opposing sides of the frame 400 and are adjusted simultaneously when a wafer 300 is to be secured. In some embodiments, the retaining arm 85 stabilizes the wafers 300 when the adjuster 80 is actuated. In some embodiments, the adjuster 80 comprises an electromechanical device for changing the position of the retaining arm 85. In some embodiments, the adjuster 80 is manually actuated. In some examples, the position sensor 95 or other sensor senses a strain on the retaining arm 85 and when a threshold strain value is sensed, the adjuster 80 will stop moving the retaining arm 85 further so as to prevent inducing damage on the wafer 300.

FIG. 4B illustrates the vertical position of the retaining arm 85 as the wafer 300 is being placed on the shelf 110. FIG. 4C shows, in sequence, an incremental adjustment of the position of the retaining arm 85 away from the vertical and towards the horizontal as the adjuster 80 is adjusting its position. FIG. 4D shows, in sequence, the substantially horizontal position of the retaining arm 85 as it engages with a top surface of the edge of the wafer 300 in order to secure the wafer 300 to the shelf 110 or pair of shelves 100. More than one wafer 300 is placed and secured simultaneously in this manner on separate stacked shelves 110, 120, in various instances.

Figure 4F:
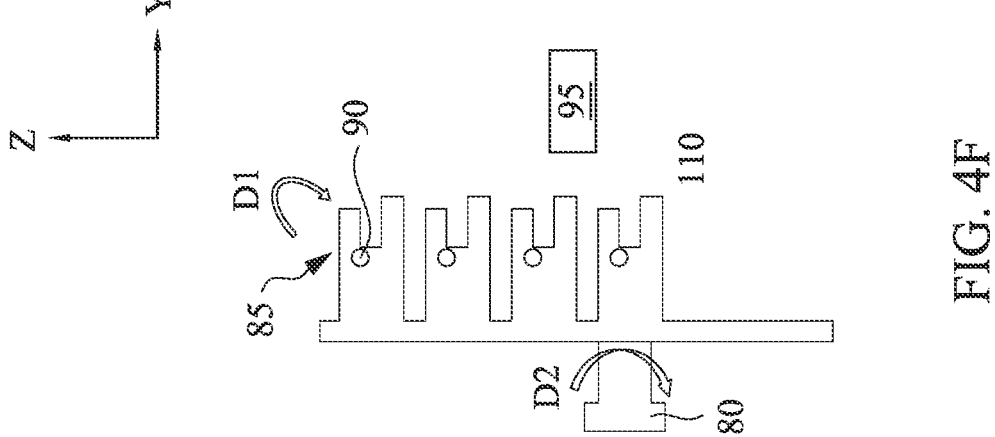
FIG. 4F is a side view of several shelves in accordance with some embodiments.
Figure 4E:
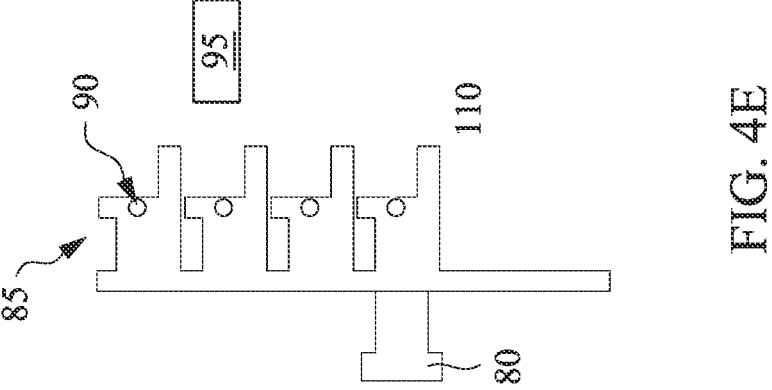
FIG. 4E is a side view of several shelves in accordance with some embodiments.

FIG. 4E shows some embodiments of the settler 60 of FIGS. 4B-4D in greater detail. In some embodiments, the retaining arm 85 is motivated to move by adjuster 80 via the use of one or more gears 90. In various embodiments, the one or more gears are rotated when the adjuster 80 is appropriately actuated. In some instances, the one or more gears 90 rotate in a first direction to move the retaining arm 85 from a horizontal to a vertical position. In some embodiments, the one or more gears 90 rotate in a second direction to move the retaining arm 85 from a vertical position to a horizontal position. In FIG. 4E, the retaining arm 85 is shown in a substantially horizontal position prior to a wafer 300 being loaded. In FIG. 4F, the retaining arm 85 is shown in a substantially vertical position to secure the wafer 300 after being loaded.

Figure 5A:
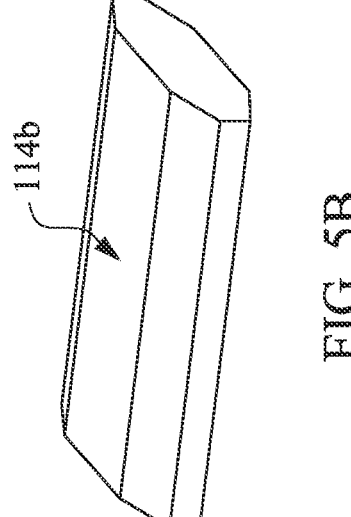
FIG. 5A, FIG. 5B, FIG. 5C and FIG. 5D are schematic views of various wafer settlers in accordance with some embodiments.
Figure 5B:
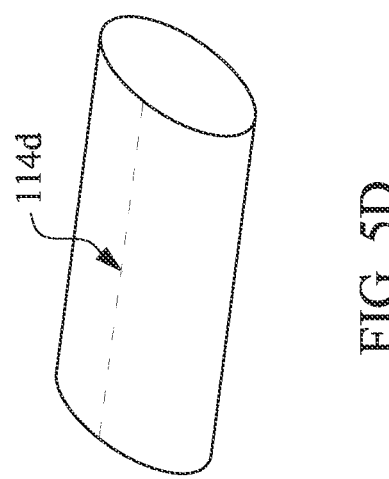
Figure 5C:
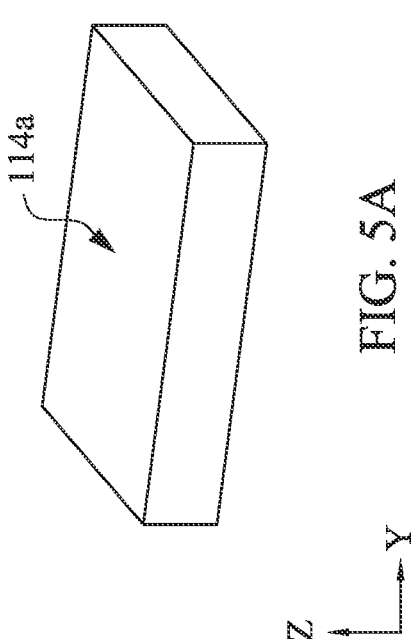
Figure 5D:
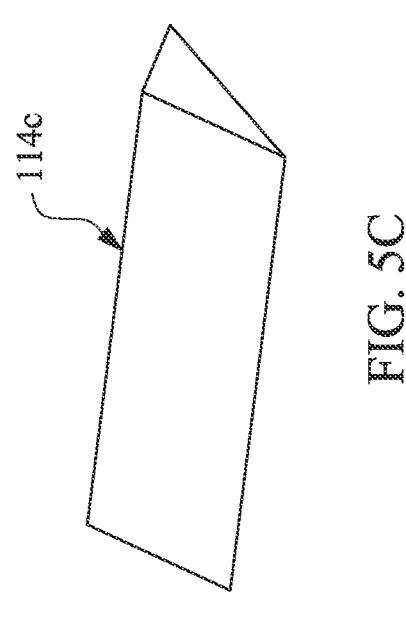

Referring now to FIG. 5A through FIG. 5D, in various embodiments, at least one of the plurality of first comb portions 114 of the shelf 110 or the second comb portions 124 of the shelf 120 is a continuous structure extending in the X direction perpendicular to the pair of sidewalls 210a and 210b of the frame 400. In some embodiments, the continuous structure is a pillar structure, such as a rectangular pillar structure 114a (as shown in FIG. 5A), a triangular pillar structure 114b (as shown in FIG. 5B), a polygonal pillar structure 114c (as shown in FIG. 5C), a cylindrical pillar structure 114d (as shown in FIG. 5D), or a combination thereof. Specifically, as shown in FIG. 5A, the rectangular pillar structure 114a is in contact with the wafer 300 (as shown in FIG. 1) by a plane (or a top surface) in some instances. As shown in FIG. 5B, the triangular pillar structure 114b is in contact with the wafer 300 by a line shaped contact region in some embodiments. As shown in FIG. 5C, the polygonal pillar structure 14 is in contact with the wafer 300 by a plane (or a top surface) of reduced width compared to rectangular pillar structure 114a in some embodiments. As shown in FIG. 5D, the circular pillar structure 114d is in contact with the wafer 300 by a line in some instances. In various embodiments, the retaining arm 85 in any of the embodiments contemplated herein is one or more of the same structures as those shown in FIGS. 5A-5D.

Figure 6:
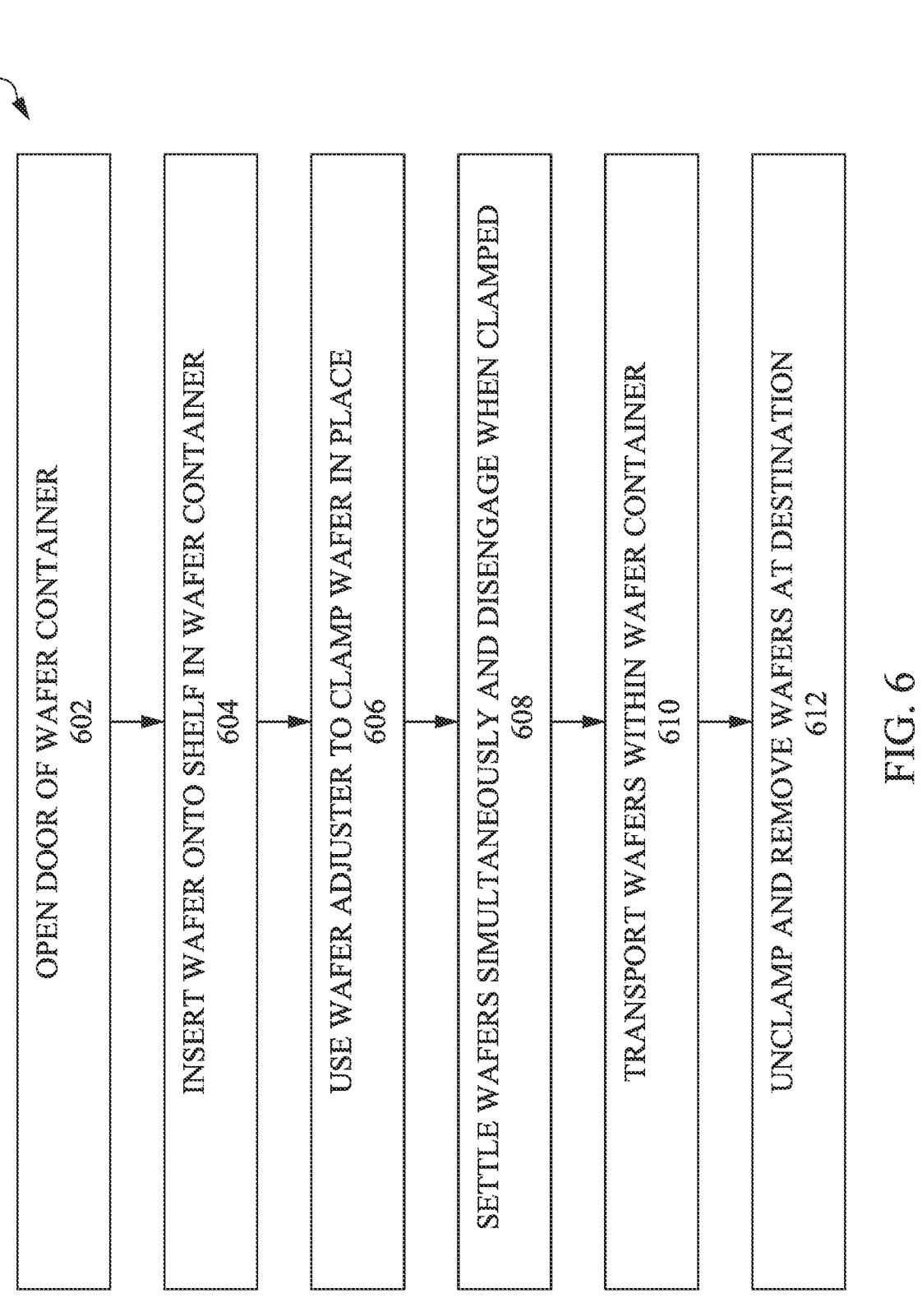
FIG. 6 is a flow chart of a wafer transport process in accordance with some embodiments.

Referring to FIG. 6, in some embodiments of the present disclosure, a method 600 for holding and securing the wafer 300 is illustrated herein, in which the wafer container 10 holds the wafer 300 with a limited number of defects formed during transport. It is noted that in addition to the following steps described, other steps are also included in the method 600 in various embodiments. Commencing at operation 602, the door 410 of the wafer container 10 is opened to expose the one or more pairs of shelves 100. In some embodiments, the door is manually or robotically opened. Next, at operation 604, a wafer 300 is inserted onto a pair of shelves 100 in the wafer container 10. Next, at operation 606, the adjuster 80 is manually or robotically actuated to begin clamping or otherwise securing the wafer 300 in place. Next, at operation 608, the wafers 300 are settled substantially simultaneously and, based on an output of the position sensor 95 or the like, the adjuster ceases to engage the retaining arm further when the wafer is sufficiently secured in place. In some embodiments, an alarm is generated by the position sensor 95 or the like when a wafer 300 is determined to be out of position (or other erroneous condition) after the adjuster 80 attempts to secure it. Once the wafers 300 are secure, at operation 610, the wafers are transported within the wafer container 10 at greater speeds than safety would allow without clamping. Finally, at operation 612, the adjusters 80 unclamp the retaining arms 85 at the destination, the door 410 is opened and the wafers are removed from the wafer container 10, after which the process 600 ends.

Various advantages of this disclosure will now be described. In some embodiments, for preventing certain features (such as a metal layer or a passivation layer) formed on the wafer 300 from being scratched, the wafer 300 is disposed on the pair of shelves 100 so that the top surface of the wafer 300 where the features are formed faces up, and the bottom surface of the wafer 300 face down and are in contact with the top of the pair of shelves 100. In some embodiments, the pair of shelves 100 are configured to provide at least three supporting points to support the wafer 300, thereby balancing the wafer 300 to prevent it from tipping during transport. In various cases, wafers can be kept in their original state while being stabilized. By stabilizing the wafers, the transportation time between FABs can be reduced, which improves the overall throughput of a semiconductor manufacturing process.

According to various embodiments, a wafer container apparatus comprises a pair of opposing sidewalls disposed within a frame, a pair of shelves disposed on the sidewalls, and a settler for securing a wafer on the pair of shelves. In some embodiments, the pair of the shelves includes at least a first shelf and a second shelf opposite to each other. In some embodiments, the first shelf includes a first comb structure having a first connection portion and a plurality of first comb portions connected to the first connection portion. In some embodiments, the second shelf includes a second comb structure having a second connection portion and a plurality of second comb portions connected to the second connection portion. In some embodiments, the plurality of first comb portions interleave with the plurality of second comb portions. In some embodiments, at least one of the first comb portions and the second comb portions extend in a direction perpendicular to the sidewalls. In some embodiments, the container is at least one of: a front opening unified pod (FOUP), a front opening shipping box (FOSB), a wafer standardized mechanical interface (SMIF) pod, and a sorter. In some embodiments, at least one clamp disposed at an interior end of the pair of shelves is configured to secure an end of a wafer during transportation thereof. In some instances, a mechanical adjuster is provided to adjust the at least one clamp. In some embodiments, a manual adjuster is provided to adjust the at least one clamp. In some embodiments, the pair of shelves include at least one engagement arm thereon that is adjustable in length and configured to secure the wafer. In some embodiments, a settler structure is disposed on the pair of shelves to support a wafer thereon. In some embodiments, the settler structure is at least one of a rectangular structure, a triangular structure, a polygonal structure, and a cylindrical structure.

According to various embodiments, an apparatus for carrying wafers has a frame, a first sidewall and a second sidewall disposed on opposite sides of the frame, a first shelf disposed on the first sidewall, a second shelf disposed on the second sidewall and separated by a distance from the first shelf, where the first shelf and the second shelf are configured to cooperatively support a wafer, a securing arm disposed towards an interior end of at least one of the first shelf and the second shelf, and an adjuster configured to change a position of the securing arm in order to secure the wafer. In some embodiments, a position sensor is configured to determine a position of the securing arm. In some embodiments, the adjuster is a manual adjuster including a gear configured to change the position of the securing arm. In some embodiments, the adjuster is an electromechanical device configured to change the position of the securing arm. In some embodiments, a settler structure is disposed on the pair of shelves to support a wafer thereon. In some embodiments, the settler structure is at least one of a rectangular structure, a triangular structure, a polygonal structure, and a cylindrical structure.

According to various embodiments, a method for securing a wafer within a wafer container includes robotically opening a door of a container, robotically inserting a wafer onto a shelf disposed within the container, and adjusting a position of a securing arm disposed on the shelf, the securing arm configured to secure the wafer. In some embodiments, the method further includes measuring the position of the securing arm by a position sensor. In some embodiments, the method further includes generating an alert when the position is determined to be erroneous. In some embodiments, the method further includes electromechanically adjusting the securing arm based on the position measured by the position sensor. In some embodiments, said adjusting further includes adjusting the position of the securing arm using a manually operated adjuster.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer container apparatus, comprising:
a pair of opposing sidewalls disposed within a frame;
a pair of shelves disposed on the sidewalls, wherein the pair of shelves includes at least one engagement arm thereon that is adjustable in length and configured to secure a wafer; and
a settler for securing the wafer on the pair of shelves by gripping an edge of the wafer.

2. The apparatus of claim 1, wherein the pair of the shelves comprises a first shelf and a second shelf opposite to each other, the first shelf including a first comb structure having a first connection portion and a plurality of first comb portions connected to the first connection portion, and the second shelf including a second comb structure having a second connection portion and a plurality of second comb portions connected to the second connection portion.

3. The apparatus of claim 2, wherein the plurality of first comb portions interleave with the plurality of second comb portions.

4. The apparatus of claim 2, wherein at least one of the first comb portions and the second comb portions extend in a direction perpendicular to the sidewalls.

5. The apparatus of claim 1, wherein the container comprises at least one of: a front opening unified pod (FOUP), a front opening shipping box (FOSB), a wafer standardized mechanical interface (SMIF) pod, and a sorter.

6. The apparatus of claim 1, wherein the settler includes at least one clamp disposed at an interior end of the pair of shelves configured to secure an end of a wafer during transportation of the apparatus.

7. The apparatus of claim 6, further comprising an adjuster configured to electromechanically adjust the at least one clamp.

8. The apparatus of claim 6, further comprising an adjuster configured to manually adjust the at least one clamp.

9. The apparatus of claim 1, further comprising:
a settler structure disposed on the pair of shelves configured to support a wafer thereon, the settler structure comprising at least one of a rectangular structure, a triangular structure, a polygonal structure, and a cylindrical structure.

10. An apparatus for carrying wafers, comprising:
a frame;
a first sidewall and a second sidewall disposed on opposite sides of the frame;
a first shelf disposed on the first sidewall;

14 a second shelf disposed on the second sidewall and separated by a distance from the first shelf, the first shelf and the second shelf configured to cooperatively support a wafer;
a securing arm disposed towards an interior end of at least one of the first shelf and the second shelf; and
an adjuster configured to change a position of the securing arm in order to secure the wafer by gripping an edge of the wafer.

11. The apparatus of claim 10, further comprising a position sensor configured to determine a position of the securing arm.

12. The apparatus of claim 10, wherein the adjuster comprises a manual adjuster including a gear configured to change the position of the securing arm.

13. The apparatus of claim 10, wherein the adjuster comprises an electromechanical device configured to change the position of the securing arm.

14. The apparatus of claim 10, further comprising:
a settler structure disposed on the first shelf, the settler structure configured to support a bottom of a wafer, the settler structure comprising at least one of a rectangular structure, a triangular structure, a polygonal structure, and a cylindrical structure.

15. A method for securing a wafer within a wafer container, comprising:
robotically opening a door of a container;
robotically inserting a wafer onto a shelf disposed within the container; and
adjusting a position of a securing arm disposed on the shelf, the securing arm configured to secure the wafer by gripping an edge of the wafer.

16. The method of claim 15, further comprising measuring the position of the securing arm by a position sensor.

17. The method of claim 16, further comprising generating an alert when the position is determined to be erroneous.

18. The method of claim 16, further comprising electromechanically adjusting the securing arm based on the position measured by the position sensor.

19. The method of claim 15, wherein the adjusting further comprises adjusting the position of the securing arm using a manually operated adjuster.

20. The apparatus of claim 10, wherein the first shelf and the second shelf include at least one engagement arm thereon that is adjustable in length and configured to secure the wafer.

* * * * *